United States Patent [19]

Nomura et al.

[11] Patent Number: 5,424,905
[45] Date of Patent: Jun. 13, 1995

[54] PLASMA GENERATING METHOD AND APPARATUS

[75] Inventors: Noboru Nomura, Kyoto; Kenji Harafuji, Osaka; Masafumi Kubota, Osaka; Tokuhiko Tamaki, Osaka; Mitsuhiro Ohkuni, Osaka; Ichiro Nakayama, Osaka, all of Japan

[73] Assignee: Matsushita Electric Company, Ltd., Osaka, Japan

[21] Appl. No.: 40,297

[22] Filed: Mar. 30, 1993

[30] Foreign Application Priority Data

Mar. 31, 1992 [JP] Japan .................................. 4-077781

[51] Int. Cl.⁶ .......................................... H01J 37/317
[52] U.S. Cl. .................................... 361/235; 250/492.2
[58] Field of Search ......................... 361/235; 422/292; 250/491.21, 492.2; 156/643, 345, 646, 626–627; 204/192.32, 298.06, 298.34; 118/723 MR, 723 I; 219/121.48, 121.52, 121.43–121.44

[56] References Cited

U.S. PATENT DOCUMENTS

| | | | |
|---|---|---|---|
| 5,110,438 | 5/1992 | Ohmi et al. | 204/298.34 |
| 5,127,988 | 7/1992 | Kawamura et al. | 156/643 |
| 5,132,544 | 7/1992 | Glauish | 250/492.2 |
| 5,162,633 | 11/1992 | Sonobe et al. | 219/121.43 |
| 5,200,158 | 4/1993 | Jacob | 422/292 |
| 5,242,561 | 9/1993 | Sato | 204/192.33 |
| 5,290,993 | 3/1994 | Kaji et al. | 219/121.43 |

FOREIGN PATENT DOCUMENTS

| | | |
|---|---|---|
| 60-153129 | 8/1985 | Japan . |
| 62-44576 | 2/1987 | Japan . |
| 62-273731 | 11/1987 | Japan . |
| 3-30424 | 2/1991 | Japan . |

Primary Examiner—R. Skudy
Assistant Examiner—Aditya Krishnan
Attorney, Agent, or Firm—Willian Brinks Hofer Gilson & Lione

[57] ABSTRACT

Three electrodes are disposed at lateral sides of a plasma generating chamber of an etching apparatus serving as a plasma generating apparatus. A sample stage is disposed at a lower part of the plasma generating chamber, and an opposite electrode is disposed at an upper part thereof. High frequency electric power having a first frequency is supplied to the sample stage and the opposite electrode. Respectively supplied to the three electrodes 4, 5, 6 are high frequency electric powers which are oscillated by a three-phase magnetron, which have a second frequency different from the first frequency and of which respective phases are successively different by about 120° from one another, thus forming a rotational electric field in the plasma generating chamber.

18 Claims, 16 Drawing Sheets

PLASMA GENERATING METHOD AND APPARATUS

BACKGROUND OF THE INVENTION

The present invention relates to a plasma generating method and apparatus.

A plasma generating method using high frequency electric discharge is used in the fields of dry-etching apparatus for microfabrication, plasma CVD apparatus or sputtering apparatus for forming thin films, ion implantation apparatus and the like. In such a plasma generating method, it is required to generate a plasma under a high vacuum in order to miniaturize the feature sizes or to control the film quality with high precision.

The following will discuss a dry etching method for microfabrication as an example of application of the plasma generating method.

The recent progress in the field of highly dense semiconductor integrated circuit s is bringing about great changes equivalent to those brought by the Industrial Revolution. The highly dense arrangement of a semiconductor integrated circuit has been achieved by miniaturization of element dimensions, improvements in devices, provision of large-area chips and the like. Element dimensions are now miniaturized to the extent of the wavelength of light. In lithography, the use of excimer laser or soft X-ray is taken into consideration. To realize micro-patterns, dry etching plays an important role as lithography does.

Dry etching is a proess technology for removing unnecessary parts of a thin film or a substrate with the use of chemical or physical reactions on the surface of a gas-solid phase of radicals, ions or the like present in a plasma. As dry etching, there is most widely used a reactive ion etching (RIE), according to which a sample is exposed to a high-frequency discharge plasma of a suitable gas, so that an etching reaction is generated on the sample surface to remove unnecessary parts thereof. Generally, the necessary parts or parts not to be removed of the sample surface, are to be protected by a photo-resist pattern serving as a mask.

For miniaturization, it is required to properly arrange ions in direction. In this connection, it is important to reduce ion scattering in the plasma. To properly arrange the ions in direction, it is effective to decrease the pressure in a plasma generating apparatus to increase the mean free path of the ions. However, when the pressure in the plasma chamber is decreased, this presents the problem that discharge of high frequency hardly occurs.

In view of the foregoing, there has been developed a method of applying a magnetic field to a plasma chamber to facilitate discharge, e.g., a magnetron reactive ion etching technology, an electron cyclotron resonance etching technology (ECR), or the like.

FIG. 17 is a schematic diagram of a reactive ion etching apparatus using conventional magnetron discharge. Reactive gas is introduced into a metallic chamber 51 through a gas controller 52. The pressure in the chamber 51 is controlled to a suitable value by an exhaust system 53. An anode 54 is disposed at an upper part of the chamber 51, and a sample stage 55 serving as a cathode is disposed at a lower part of the chamber 51. An RF power supply 57 is connected to the sample stage 55 through an impedance matching circuit 56, so that high frequency discharge takes place between the sample stage 55 and the anode 54.

Disposed at the lateral sides of the chamber 51 are two pairs of AC electromagnets 58 of which phases are shifted by 90°, the AC electromagnets 58 of each pair being opposite to each other. By the two pairs of AC electromagnets 58, a rotational magnetic field is applied into the chamber 51 to facilitate discharge under a high vacuum. With such an arrangement, the rotational magnetic field causes electrons to present cycloid motions. This lengthens the motional passages of the electrons to increase the efficiency of ionization.

FIG. 18(a) shows an example of etching boron phosphorus glass with a conventional magnetron reactive ion etching apparatus or ECR (electron cyclotron resonance) etching apparatus. In FIG. 18(a), there are shown a Si substrate 60, boron phosphorus glass 61 and a photo-resist pattern 62.

Such a conventional apparatus disadvantageously provokes damages to devices as set forth in the following.

In the conventional magnetron reactive ion etching apparatus, the rotational magnetic field averages the uneven distribution of a plasma with the passage of time, causing the plasma ununiformity to be equalized. However, since the momentary densities of the plasma are not always uniform, the potentials locally differ from one another. Accordingly, when the conventional magnetron reactive ion etching apparatus is applied to a MOSLSI process, there is a possibility of a gate oxide layer being broken.

In the ECR etching apparatus, too, since the magnetic field is distributed in the radial direction of the chamber as shown in FIG. 18(b), the plasma densities are locally coarse and dense. This causes the etching source to be ununiform or produces local differences in potential.

In view of the foregoing, the present invention is proposed with the object of generating a highly dense plasma excellent in uniformity under a high vacuum.

SUMMARY OF THE INVENTION

A first plasma generating method according to the present invention comprises the steps of: disposing a plurality of electrodes around a plasma generating part in a vacuum chamber; and respectively supplying, to the plurality of electrodes, high frequency electric powers which are supplied from a high frequency AC power supply, which have the same frequency, and of which phases are different from one another, causing each of electrons in the plasma generating part to be so moved as to draw Lissajous's trajectories; whereby a highly dense and uniform plasma is generated in the plasma generating part.

A second plasma generating method according to the present invention comprises the steps of: disposing three electrodes at lateral sides of a plasma generating part in a vacuum chamber; and respectively supplying, to the three electrodes, high frequency electric powers which are supplied from a three-phase high frequency AC power supply, which have the same frequency, and of which respective phases are successively different by 120° from one another, causing each of electrons in the plasma generating part to be so moved as to draw Lissajous's trajectories; whereby a highly dense and uniform plasma is generated in the plasma generating part.

A third plasma generating method according to the present invention comprises the steps of: disposing four or more electrodes at lateral sides of a plasma generating part in a vacuum chamber; and respectively supplying, to the four or more electrodes, high frequency electric powers which are supplied from a high frequency AC power supply, which have the same frequency, and of which respective phases are successively different from one another, thereby to apply, to the plasma generating part, a rotational electric field such that potential pockets are rotated, causing electrons in the plasma generating part to be rotated as confined in the potential pockets; whereby a highly dense and uniform plasma is generated in the plasma generating part.

According to each of the plasma generating methods of the present invention, there are supplied, to a plurality of electrodes, high frequency electric powers which have the same frequency and of which respective phases are different from one another. Accordingly, electrons which advance in the plasma generating part by the kinetic energies inherent in the electrons, present oscillating motions or rotational motions. This causes the electrons in the plasma generating part to present translational cycloid motions in which the centers of the oscillating motions or the rotational motions advance (like motions in each of which a Lissajous's trajectory is drawn). In particular, when three or more electrodes are disposed at lateral sides of the plasma generating part and there are supplied, to the three or more electrodes, high frequency electric powers which have the same frequency and of which respective phases are successively different from one another, electrons in the plasma generating part are rotated as confined in potential pockets formed in the plasma generating part.

Accordingly, a high efficiency of ionization can be obtained even under a high vacuum and electric discharge can be facilitated. Therefore, as compared with a magnetron reactive etching using a conventional magnetic field, the electric field can be more uniform so that there can be obtained a highly dense plasma excellent in uniformity.

Accordingly, when each of these plasma generating methods according to the present invention is applied to an etching apparatus, the uniformity of etching is improved and the plasma is hardly unevenly distributed, thus minimizing damages to devices such as breakdown of gate oxide layers or the like.

A first plasma generating apparatus according to the present invention comprises: a vacuum chamber having a plasma generating part; a plurality of electrodes disposed at lateral sides of the plasma generating part; and high frequency AC supplying means for respectively supplying, to the plurality of electrodes, high frequency electric powers which have the same frequency and of which respective phases are different from one another, causing each of the electrons in the plasma generating part to be so moved as to draw Lissajous's trajectories.

A second plasma generating apparatus according to the present invention comprises: a vacuum chamber having a plasma generating part; three electrodes disposed at lateral sides of the plasma generating part; and three-phase high frequency AC supplying means for respectively supplying, to the three electrodes, high frequency electric powers which have the same frequency and of which respective phases are successively different by 120° from one another, causing each of electrons in the plasma generating part to be so moved as to draw a Lissajous's trajectory.

A third plasma generating apparatus according to the present invention comprises: a vacuum chamber having a plasma generating part; four or more electrodes disposed at lateral sides of the plasma generating part; and electric field applying means for respectively supplying, to the four or more electrodes, high frequency electric powers which have the same frequency and of which respective phases are successively different from one another, thereby to apply, to the plasma generating part, a rotational electric field adapted to form potential pockets to be rotated with electrons in the plasma generating part confined in the potential pockets.

When each of the plasma generating apparatus according to the present invention further has a sample stage disposed at a lower part of the plasma generating part and an opposite electrode disposed at an upper part of the plasma generating part, each of the plasma generating apparatus is suitable for etching.

When, in each of the plasma generating apparatus above-mentioned, the high frequency AC supplying means is formed by a magnetron of which output terminals are respectively connected to the plurality of electrodes, there can be readily and securely supplied, to the electrodes, high frequency electric powers which have the same frequency and of which phases are different from one another.

When, in each of the plasma generating apparatus above-mentioned, the high frequency AC supplying means comprises: a high frequency AC power supply for supplying high frequency electric powers which have the same frequency and of which respective phases are different from one another; and a high frequency AC amplifying device for amplifying the high frequency electric powers supplied from the high frequency AC power supply and for supplying the high frequency electric powers thus amplified to the plurality of electrodes, there can be readily and securely supplied, to the electrodes, high frequency electric powers which have the same frequency and of which phases are different from one another. In such an arrangement, when the number of the electrodes is an even number, the high frequency AC power supply may be a single-phase magnetron and the high frequency AC amplifying device may be a single-phase amplitron of which input terminals are connected to the output terminals of the single-phase magnetron and of which output terminals are respectively connected to the electrodes.

When, in each of the plasma generating apparatus above-mentioned, the high frequency AC power supply is formed by a magnetron for generating an alternating current and the high frequency AC amplifying device is formed by an amplitron of which input terminals are connected to the output terminals of the magnetron and of which output terminals are respectively connected to the electrodes, there can be readily and securely supplied, to the electrodes, high frequency electric powers which have the same frequency and of which respective phases are different from one another. In such an arrangement, when the number of the electrodes is an even number, the high frequency AC amplifying device may be a single-phase magnetron of which output terminals are respectively connected to the electrodes.

DETAILED DESCRIPTION OF THE INVENTION

The following description will discuss a plasma generating apparatus according to a first embodiment of the present invention. This plasma generating apparatus is adapted to conduct dry-etching.

Figure 1:
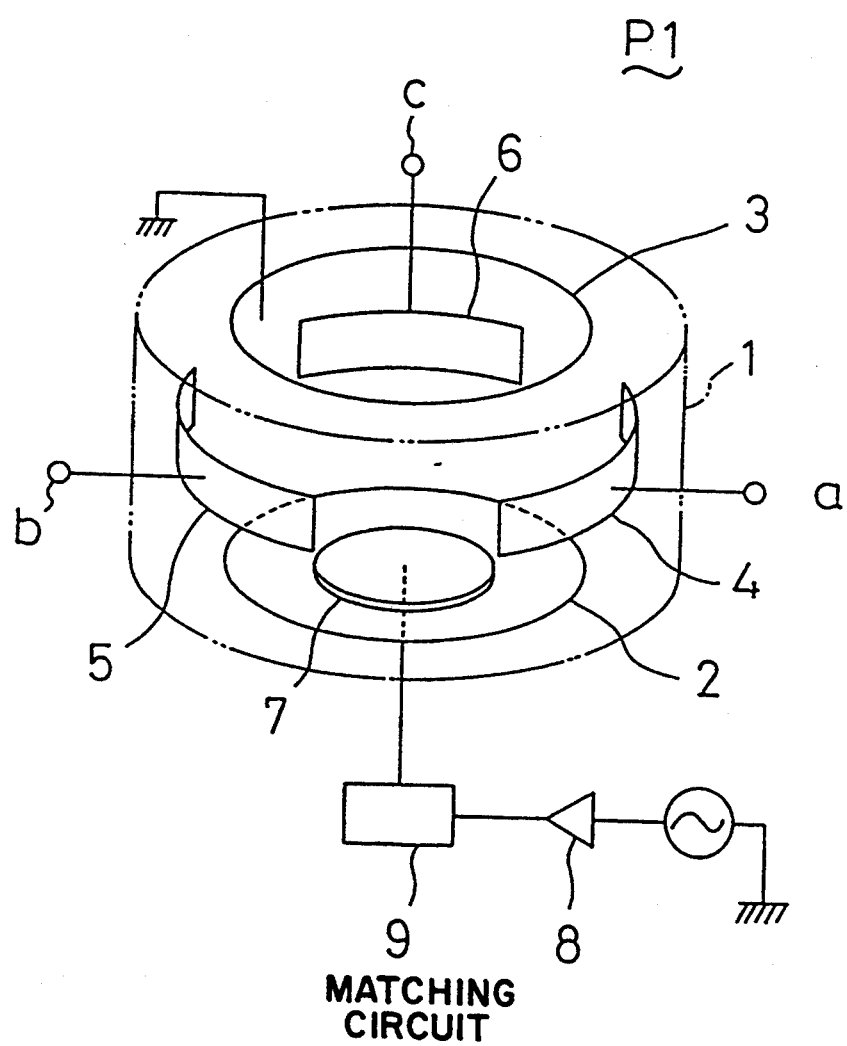
FIG. 1 is a schematic diagram showing the structure of a dry etching apparatus having three electrodes, as a plasma generating apparatus, according to a first embodiment of the present invention.

FIG. 1 is a schematic diagram of the structure of a plasma generating apparatus P1. In FIG. 1, disposed at a lower part of a cylindrical chamber 1 is a sample stage 2 to which applied is high frequency electric power of 13.56 MHz for accelerating ions for effecting dry-etching. A grounding electrode 3 serving as an opposite electrode is disposed at an upper part of the chamber 1. Disposed at lateral sides of the chamber 1 are cathode electrodes 4, 5, 6 to which applied are high frequency electric powers of 300 MHz to be used for generating a plasma for supplying ions. A wafer 7 to be dry-etched is placed on the sample stage 2.

The respective phases of the high frequency electric powers applied to the cathode electrodes 4, 5, 6 are different by about 120° from one another. The high frequency electric powers applied to the cathode electrodes 4, 5, 6 are supplied through terminals a, b, c, to which a three-phase magnetron M1 (See FIG. 2) to be discussed later is connected. In FIG. 1, an amplifier 8 is disposed for supplying high frequency electric power to the sample stage 2 through a matching circuit 9. The pressure in the chamber 1 is controlled in the range from about 0.1 Pa to about 10 Pa by a turbo pump (not shown).

Figure 2:
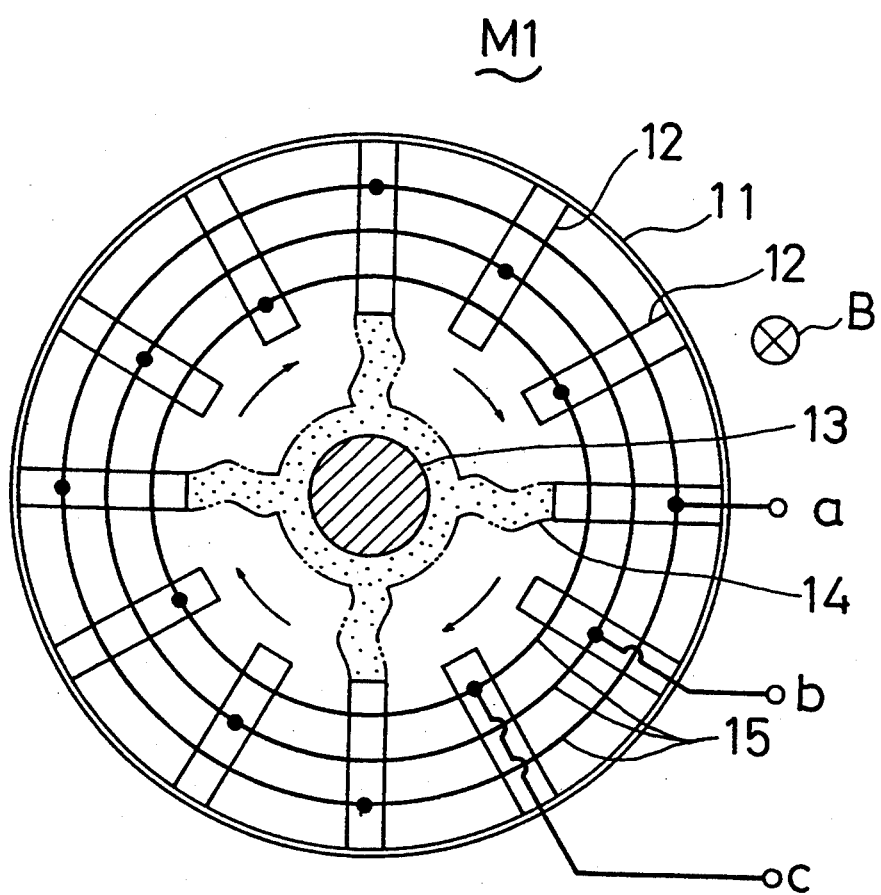
FIG. 2 is a sectional schematic diagram of a three-phase magnetron.

FIG. 2 is a sectional schematic diagram of the three-phase magnetron M1. As shown in FIG. 2, anodes 12 are disposed at regular spatial intervals in a cylindrical anode case 11, and a cathode 13 is disposed at the center thereof. Electrons emitted from the cathode 13 are rotated in a space between the cathode 13 and the anodes 12. In FIG. 2, a magnetic field B is formed for confining electrons. The reason why the magnetic field is applied, will be discussed later with reference to FIG. 12.

The anodes 12 and hollow parts in the cylindrical anode case 11 operate in the same manner as in a filter-type delay circuit. Electromagnetic waves generated in the delay circuit cause the electrons to be collected in the form of a group. As shown in FIG. 2, the electron group emitted from the cathode 13 forms electron poles 14 extending from the cathode 13 to the anodes 12. The electron group forming the electron poles 14 is rotated in an endless manner, and the electron poles 14 are rotated around the cathode 13. Accordingly, the three-phase magnetron M1 oscillates electric power. After the voltage of the electric power thus oscillated is averaged by strappings 15, the electric power is taken out from the output terminals a, b, c.

Figure 3:
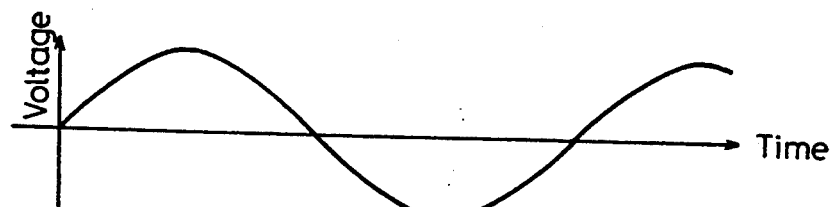
FIG. 3 shows the waveforms of voltages taken out from ouput terminals a, b, c of the three-phase magnetron shown in FIG. 2.
Figure 3:
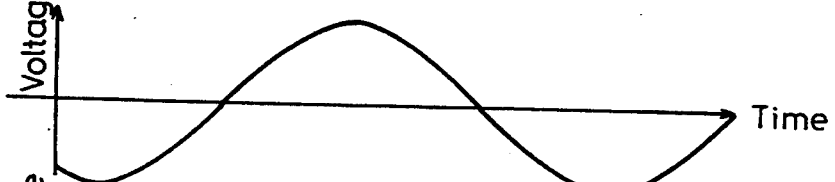
Figure 3:
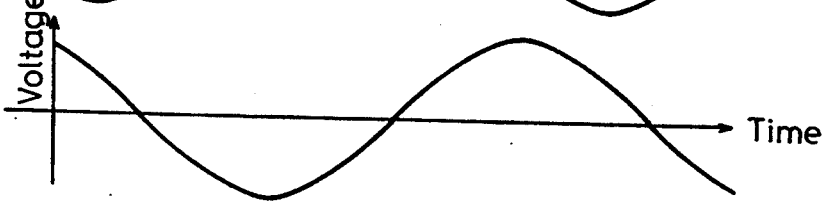

FIGS. 3(a), (b) and (c) show the waveforms of voltages taken out from the output terminals a, b, c. The waveform (a) of the voltage taken out from the output terminal a is shifted in phase by 120° from the waveform (b) of the voltage taken out from the output terminal b, which is shifted in phase by 120° from the waveform (c) of the voltage taken out from the output terminal c. When it is now supposed that the division number of the anodes 12 is set to N and the excitation phases of the hollow parts are shifted by $\theta$ from one another, $N\theta$ should be equal to $2n\pi$. In such a three-phase oscillation, when N is equal to 2n, there is provided the mode in which $\theta$ is equal to $2\pi/3$, so that the hollow parts are excited in every third place.

Figure 4:
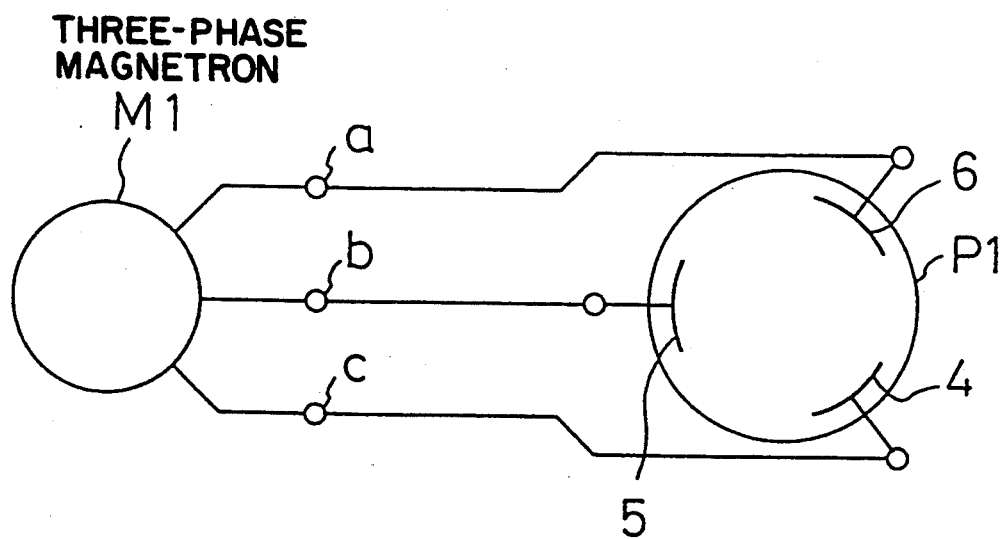
FIG. 4 is a connection diagram of the three-phase magnetron in FIG. 2 as connected to the dry etching apparatus according to the first embodiment of the present invention.

FIG. 4 is a connection diagram of the three-phase magnetron M1 as connected to the plasma generating apparatus having three electrodes P1. Three-phase AC electric power oscillated by the three-phase magnetron M1 is introduced into the plasma generating apparatus having three electrodes P1 through the output terminals a, b, c. When the high frequency alternating current generated by the three-phase magnetron M1 is supplied directly to the plasma generating apparatus P1, there can be readily obtained high frequency electric powers which have the same frequency and of which respective phases are successively different from one another.

The following description will discuss the operation of the plasma generating apparatus having the arrangement above-mentioned, with reference to FIGS. 1 to 5.

Figure 5:
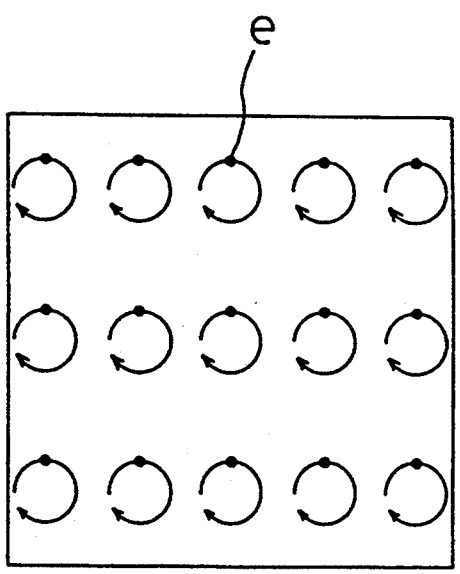
FIG. 5 is a schematic diagram of an example of the loci, as projected on a horizontal plane, of electrons in a chamber of the dry etching apparatus according to the first embodiment.

FIG. 5 schematically shows an example of the loci, as projected on a horizontal plane, of electrons in the chamber 1 of the plasma generating apparatus P1. These loci are similar to so-called Lissajous's trajectories which are observed at the time when signals which have the same frequency and of which respective phases are different by 90° from one another, are supplied to the X and Y axes of an oscilloscope. More specifically, the three-phase AC electric powers applied to the cathode electrodes 4, 5, 6 in FIG. 1 cause electrons e to present rotational motions, thus achieving a high efficiency of ionization inspire of a high vacuum, so that the plasma density is increased. In order that electrons e having energies which contribute to ionization are rotated with a radius of gyration sufficiently smaller than the sizes of the chamber 1, it is required to apply high frequency of not smaller than 50 MHz.

There was conducted a test in which there were used mixture gas containing $SF_6$ and a trace amount of oxygen and polycrystal Si doped with phosphorus as a material to be etched. From the test results, it is found that the present invention produces a greater effect when there is used, as the etching gas, electronegative gas such as $SF_6$, oxygen, chlorine, iodine or the like. This would be explained in the following manner. In a high frequency plasma of electronegative gas, the electron density is low and the resistance is high so that the potential gradient in the plasma is greater as compared with the case using electropositive gas.

The electric field formed in the electrodes is uniform, so that a plasma excellent in uniformity can be obtained and the uniformity of etching is also good. Further, the plasma is hardly unevenly distributed to considerably reduce damages to devices such as breakdown of gate oxide layers or the like. The etching rate was in the range from 200 to 400 nm/min.

As discussed in the foregoing, when there is disposed a mechanism for respectively applying, to the three cathode electrodes 4, 5, 6, high frequency electric powers which have a first frequency and of which respective phases are different substantially by 120° from one another, and for applying high frequency electric power having second frequency to a pair of electrodes, i.e., the grounding electrode 3 and the sample stage 2 on which a sample to be etched is to be placed, a plasma excellent in uniformity can be obtained and the uniformity of etching is also enhanced. Further, the plasma is hardly unevenly distributed, thus considerably reducing damages to devices such as breakdown of gate oxide layers or the like.

In the first embodiment, the sample to be etched is to be placed at the cathode electrode. However, it would be readily considered that the effects of the present invention are obtained when the sample to be etched is placed at the anode electrode. Further, in the first embodiment, the differences in phase among the high frequency electric powers applied to the three cathode electrodes 4, 5, 6 are equal to each other and fixed to a predetermined value. However, provision may be made such that such differences vary in function of time.

The following description will discuss a plasma generating apparatus, arranged as a dry-etching apparatus, according to a second embodiment of the present invention.

Figure 6:
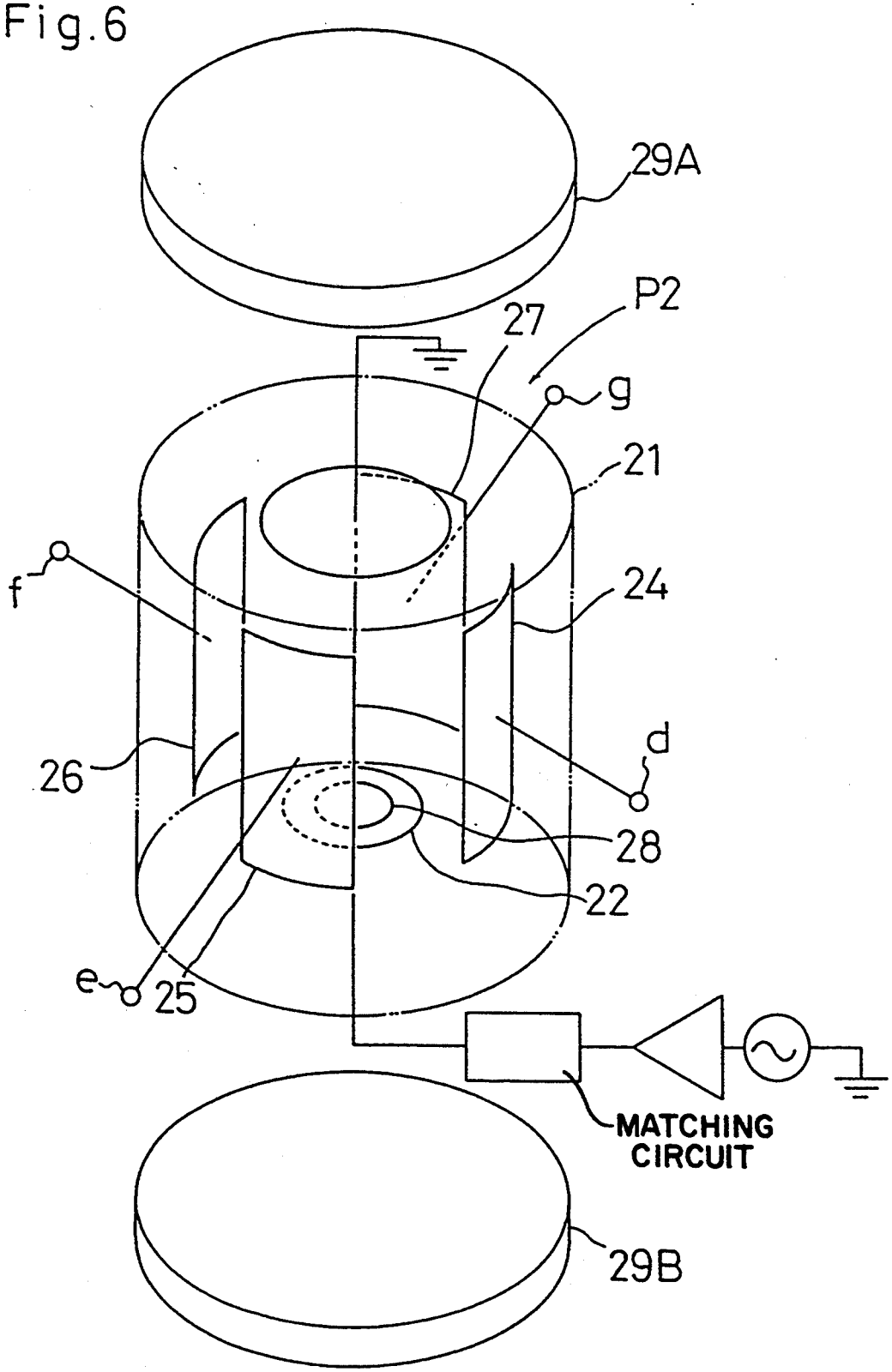
FIG. 6 is a schematic diagram showing the structure of a dry etching apparatus having four electrodes, as a plasma generating apparatus, according to a second embodiment of the present invention.

FIG. 6 is a schematic diagram of the arrangement of a plasma generating apparatus P2 according to the second embodiment. In FIG. 6, disposed at a lower part of a cylindrical chamber 21 is a sample stage 22 to which applied is high frequency electric power of 13.56 MHz. A grounding electrode 23 serves as an opposite electrode of the sample stage 22. There are disposed cathode electrodes 24, 26 to which applied are high frequency electric powers having the same frequency of 50 MHz and the same phase. There are disposed electrodes 25, 27 serving as opposite electrodes of the cathode electrodes 24, 26. High frequency electric powers applied to the cathode electrodes 24, 26 and the opposite electrodes 25, 27 are supplied through input terminals d, e, f, g, respectively. These input terminals d, e, f, g are connected to output terminals h, i of a single-phase magnetron M2 (See FIG. 7) to be discussed later. A wafer to be dry-etched 28 is placed on the sample stage 22.

A cusp magnetic field applied in the chamber 21 by a pair of upper and lower coils 29A, 29B causes a plasma to be confined. The pressure in the chamber 21 is controlled in the range from about 0.1 Pa to about 10 Pa by a turbo pump (not shown).

The second embodiment differs from the first embodiment shown in FIG. 1 in the following points. In the second embodiment, the high frequency electric powers having the same frequency of 50 MHz and having the same phase are applied to the cathode electrodes 24, 26, and the pair of upper and lower coils 29A, 29B form the cusp magnetic field to cause the plasma to be confined.

Figure 7:
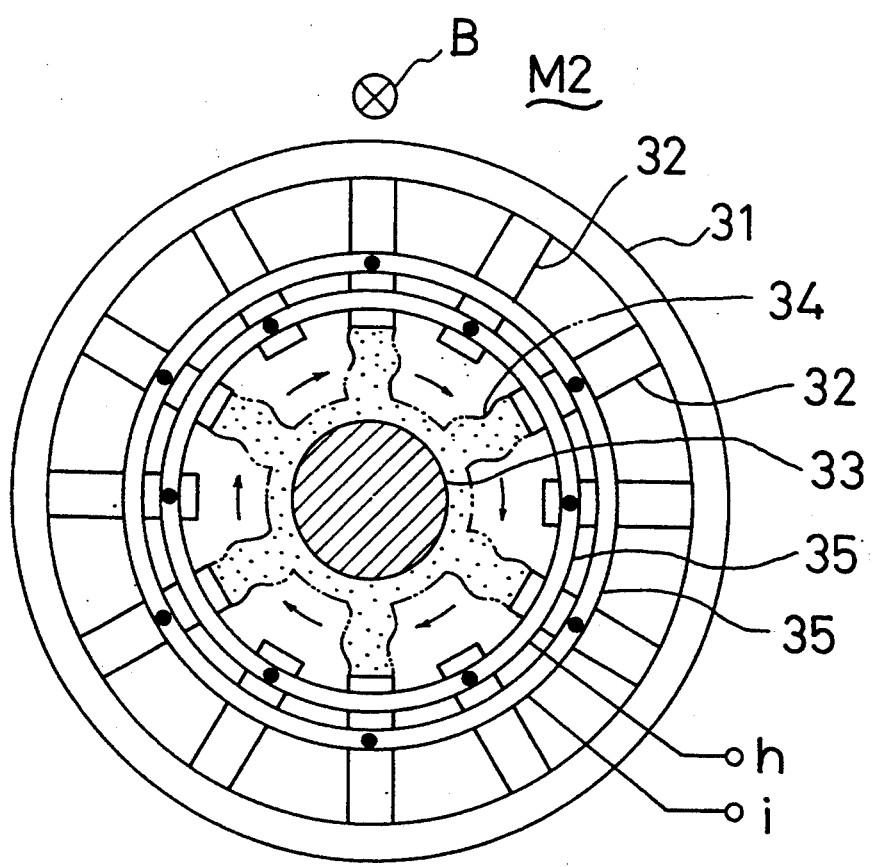
FIG. 7 is a sectional schematic diagram of a single-phase magnetron.

FIG. 7 is a sectional schematic diagram of the single-phase magnetron M2. As shown in FIG. 7, anodes 32 are disposed at regular spatial intervals in a cylindrical anode case 31, and a cathode 33 is disposed at the center thereof. Electrons emitted from the cathode 33 are rotated in a space between the cathode 33 and the anodes 32. In FIG. 7, a magnetic field B is disposed for confining electrons. The reason why the magnetic field is applied, will be discussed later with reference to FIG. 12.

The anodes 32 and hollow parts in the cylindrical anode case 31 operate in the same manner as in a filter-type delay circuit. Electromagnetic waves generated in the delay circuit cause the electrons to be collected in the form of a group. As shown in FIG. 7, electron poles 34 extend from the cathode 33 to the anodes 32. The electron group forming the electron poles 34 is rotated in an endless manner, and the electron poles 34 are rotated around the cathode 33. Accordingly, the single-phase magnetron M2 oscillates electric power. After the voltage of the electric power thus oscillated is averaged by strappings 35, the electric power is taken out through the output terminals h, i.

Figure 8:
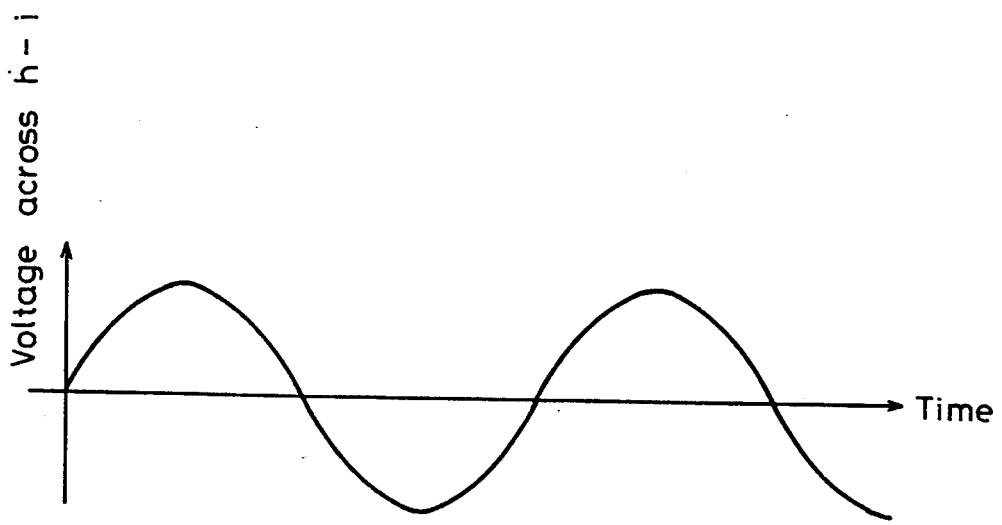
FIG. 8 shows the waveforms of voltages taken out from output terminals h, i of the single-phase magnetron shown in FIG. 7.

FIG. 8 shows the waveforms of voltages taken out from the output terminals h, i. The waveform of the voltage taken out from the output terminal h is shifted in phase by 180° from the waveform of the voltage taken out from the output terminal i. When it is now supposed that the division number of the anodes is set to N and the excitation phases of the hollow parts are shifted by $\theta$ from one another, $N\theta$ should be equal to $2n\pi$. In such a single-phase oscillation, when N is equal to 2n, there is provided the mode where $\theta$ is equal to $\pi$, so that the hollow parts are alternately excited.

Figure 9:
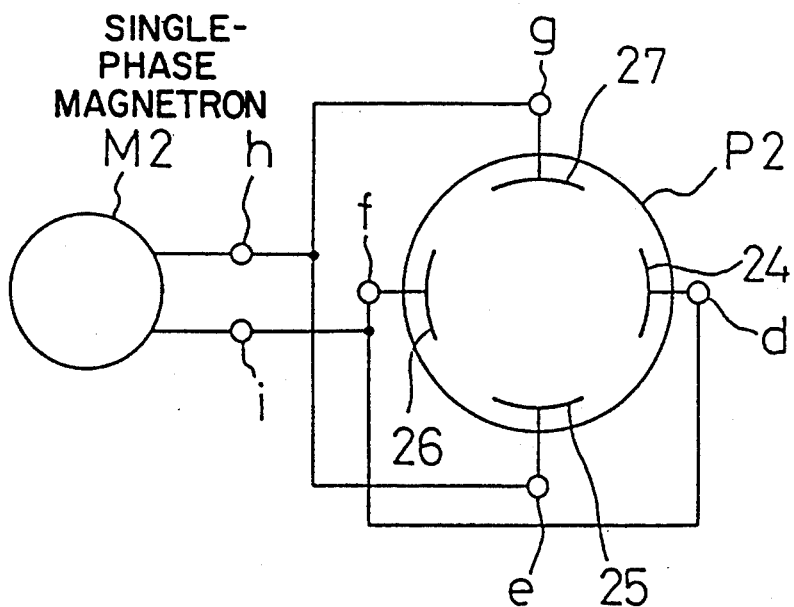
FIG. 9 is a connection diagram of the single-phase magnetron in FIG. 7 as connected to the dry etching apparatus according to the second embodiment of the present invention.

FIG. 9 is a connection diagram of the single-phase magnetron M2 as connected to the plasma generating apparatus of the four-phase four-electrode structure P2. An alternating current oscillated by the single-phase magnetron M2 is introduced into the four-phase four-electrode plasma generating apparatus P2 through the output terminals h, i of the single-phase magnetron M2 and input terminals d, e, f, g of the plasma generating apparatus P2.

Figure 10:
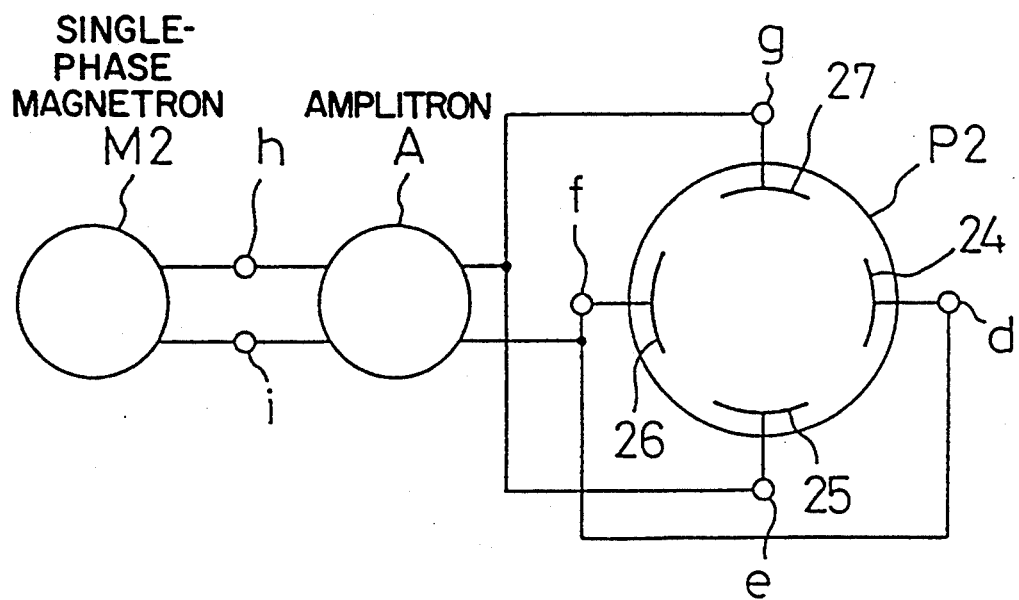
FIG. 10 is a view of an arrangement where an amplitron is connected between the single-phase magnetron in FIG. 7 and the dry etching apparatus according to the second embodiment.

FIG. 10 is a connection diagram of the single-phase magnetron M2 as connected to the four-phase four-electrode plasma generating apparatus P2 through an amplitron A.

Figure 11:
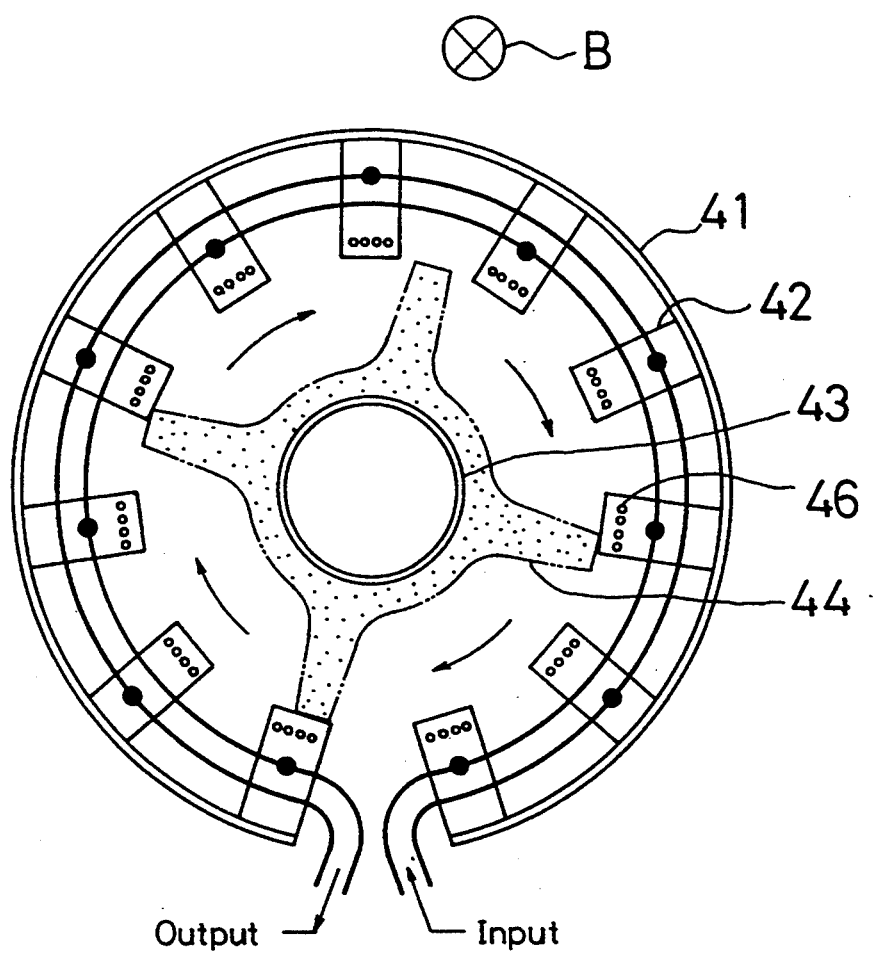
FIG. 11 is a view of the arrangement of the amplitron.

As shown in FIG. 11, the amplitron A is an amplifier using the principle of a magnetron. In the amplitron A, anodes 42 are disposed at regular spatial intervals in a cylindrical anode case 41, and a cathode 43 is disposed at the center thereof. Electrons emitted from the cathode 43 are rotated in a space between the cathode 43 and the anodes 42. In FIG. 11, cooling pipes 46 are disposed.

The anodes 42 and hollow parts in the cylindrical anode case 41 operate in the same manner as in a filter-type delay circuit. Electromagnetic waves generated in the delay circuit cause the electrons to be collected in the form of a group. As shown in FIG. 11, there are generated electron poles 44 extending from the cathode 43 to the anodes 42. The electron group forming the electron poles 44 is rotated in an endless manner, and the electron poles 44 are rotated around the cathode 43. Electric power oscillated is controlled by an input signal. The amplitron A oscillates electric power in phase identical with that of the input signal, and the electric power thus oscillated is taken out as an output. In this case, the high frequency electric power generated by the single-phase magnetron M2 is supplied to the amplitron A. The high frequency electric power which is amplified by the amplitron A and which has the same phase is then supplied as an output. With such an arrangement, the high frequency electric power can be readily amplified and the phase thereof can be maintained. When the amplitron A is used for a multiple-phase alternating current such as a three-phase alternating current as shown in the first embodiment, the effect produced by the amplitron A would be greater.

Figure 12:
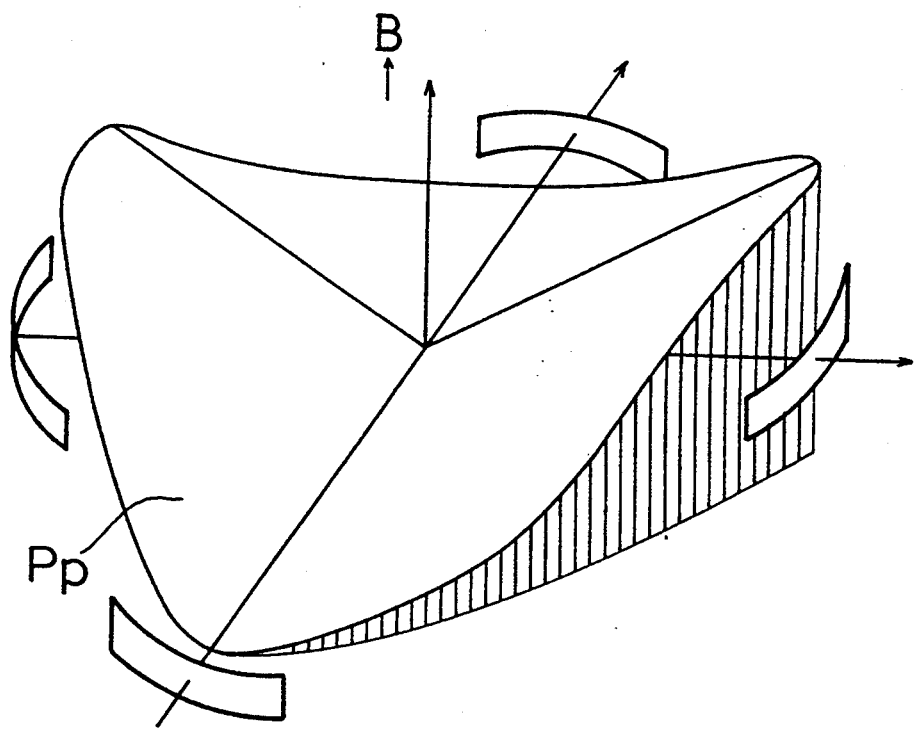
FIG. 12 is a view illustrating a potential pocket formed in the dry etching apparatus according to the second embodiment as connected to the single-phase magnetron in FIG. 7.

FIG. 12 is a view illustrating a potential pocket $P_p$ in the four-electrode four-phase plasma generating apparatus P2 as connected to the single-phase magnetron M2. Since the potential pocket $P_p$ is rotated together with the electric field, the electrons in the potential pocket $P_p$ are rotated together with the potential pocket $P_p$ to generate a highly dense plasma. At this time, the electrons are moved in the outer peripheral direction along the valley of the potential pocket to cause the plasma to be partially lost. In this connection, a magnetic field may be applied to confine the electrons. However, without such a magnetic field applied, there can be generated a plasma of which density is as high as to be practically used for a semiconductor process.

Figure 13A:
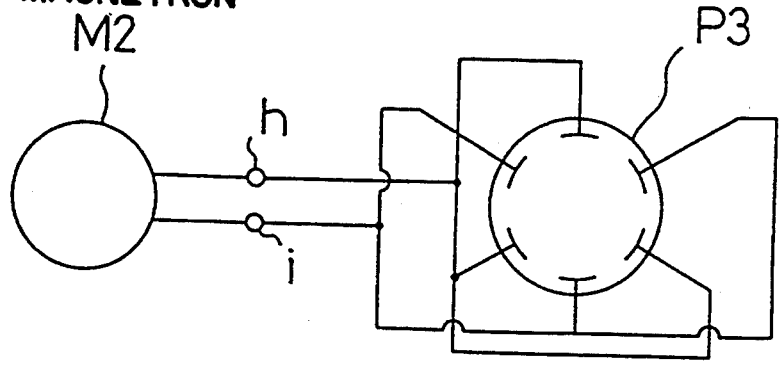
FIG. 13(a) is a connection diagram of the single-phase magnetron in FIG. 7 as connected to a dry etching apparatus having six electrodes according to a first modification of the second embodiment.
Figure 13B:
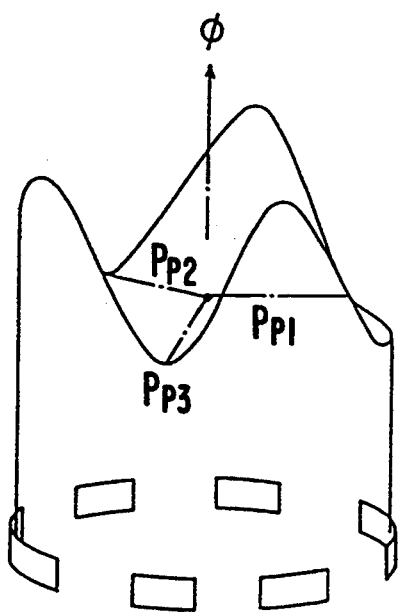
FIG. 13(b) is a view of potential pockets formed in the dry etching apparatus having six electrodes in FIG. 13(a) as connected to the single-phase magnetron in FIG. 7.

FIG. 13(a) shows potential pockets formed in a six-electrode six-phase plasma generating apparatus P3 as connected to the single-phase magnetron M2. Three potential pockets $P_{p1}$, $P_{p2}$, $P_3$ are formed in the plasma generating apparatus P3. FIG. 13(b) shows the distribution of potentials in the plasma generating apparatus P3 at a certain moment.

Figure 14A:
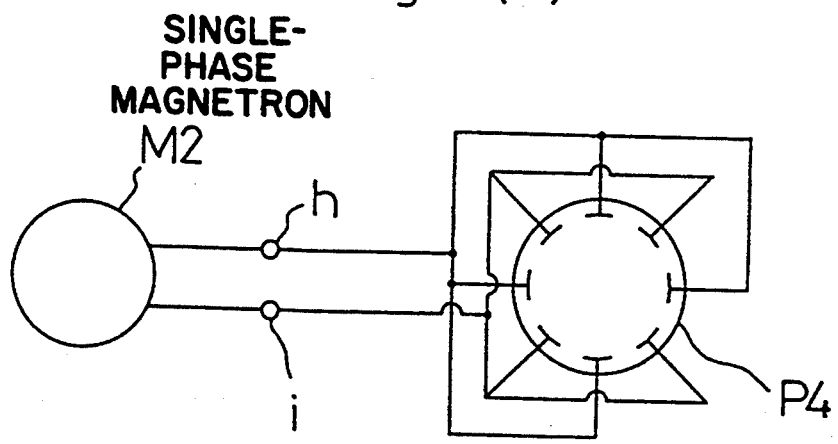
FIG. 14(a) is a connection diagram of the single-phase magnetron in FIG. 7 as connected to a dry etching apparatus having eight electrodes according to a second modification of the second embodiment.
Figure 14B:
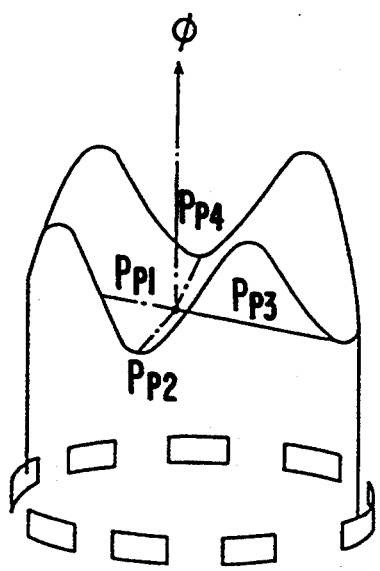
FIG. 14(b) is a view of potential pockets formed in the dry etching apparatus having eight electrodes in FIG. 14(a) as connected to the single-phase magnetron in FIG. 7.

FIG. 14(a) shows potential pockets formed in an eight-electrode eight-phase plasma generating apparatus P4 as connected to the single-phase magnetron M2. Four potential pockets $P_{p1}$, $P_{p2}$, $P_{p3}$, $P_{p4}$ are formed in the plasma generating apparatus P4. FIG. 14(b) shows the distribution of potentials in the plasma generating apparatus P4 at a certain moment.

When the number of potential pockets is increased in the manner above-mentioned, the energy of the rotational magnetic field can be efficiently transferred to a plasma, thus further improving the plasma in uniformity.

The following description will discuss the plasma generating apparatus according to a third embodiment of the present invention. This plasma generating apparatus is so adapted as to effect a CVD.

Figure 15:
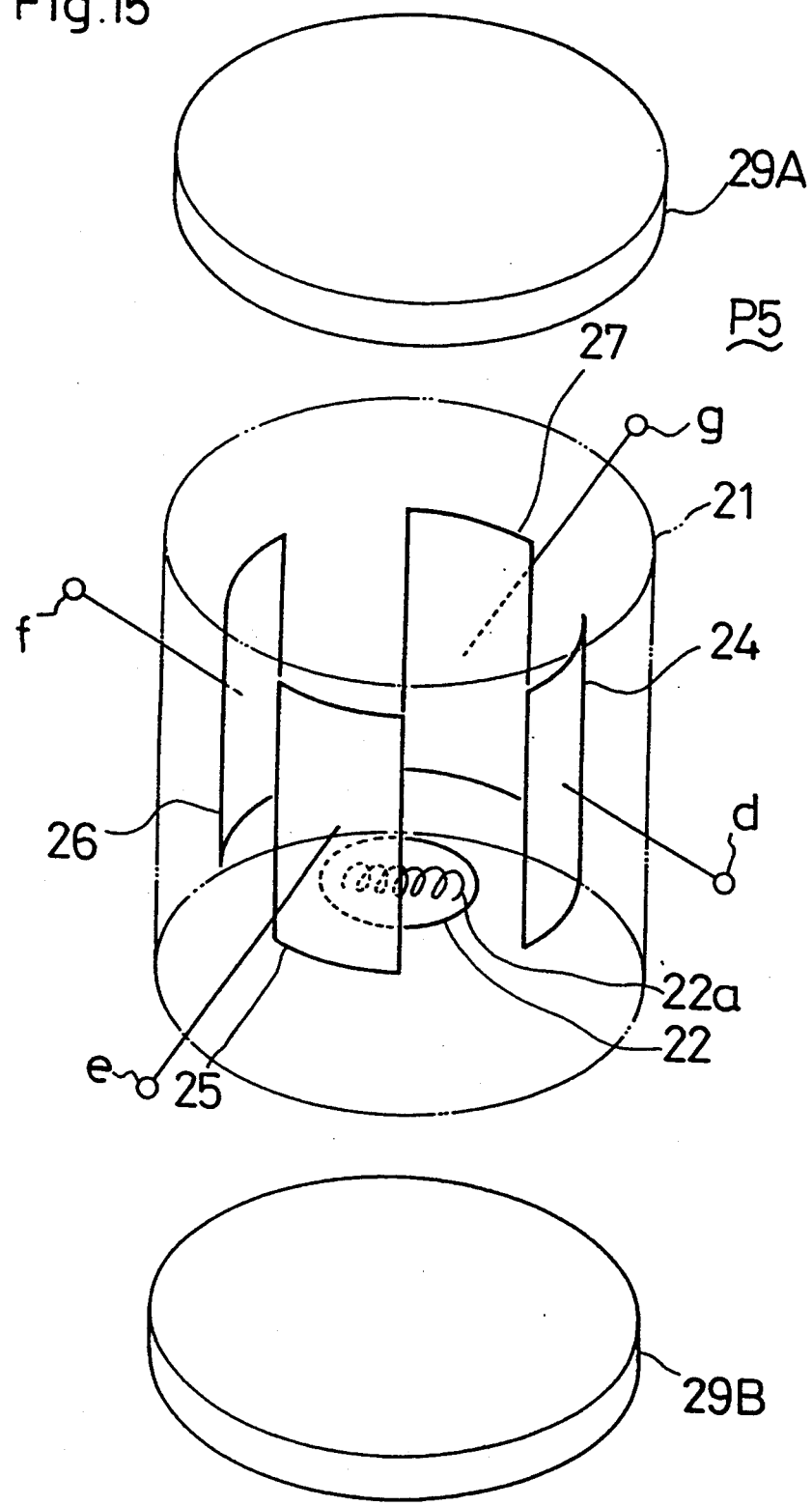
FIG. 15 is a schematic diagram illustrating the structure of a CVD apparatus having four electrodes, as a plasma generating apparatus, according to a third embodiment of the present invention.

FIG. 15 is a schematic diagram of the structure of the plasma generating apparatus P5 according to the third embodiment.

The plasma generating apparatus P5 according to the third embodiment differs in the following two points from the plasma generating apparatus P2 in FIG. 6 according to the second embodiment. That is, the plasma generating apparatus P5 in FIG. 15 does not have means for supplying high frequency electric power to the sample stage 22 and the opposite electrode 23 shown in FIG. 6, and the plasma generating apparatus P5 in FIG. 15 is provided on the sample stage 22 with a heater 22a for controlling the thickness of a deposit film. Other arrangements than the two points above-mentioned are the same as those of the plasma generating apparatus P2 shown in FIG. 6. Accordingly, like parts are designated by like reference numerals used in FIG. 6 and a detailed description thereof is here omitted.

In the CVD apparatus, 15 sccm of $N_2$ gas and 15 sccm of $SiH_4$ gas are introduced into the chamber 1. Preferably, the pressures of these gases are set to 0.07 Pa and the temperature of the sample stage 22 is set to 400° C.

Figure 16:
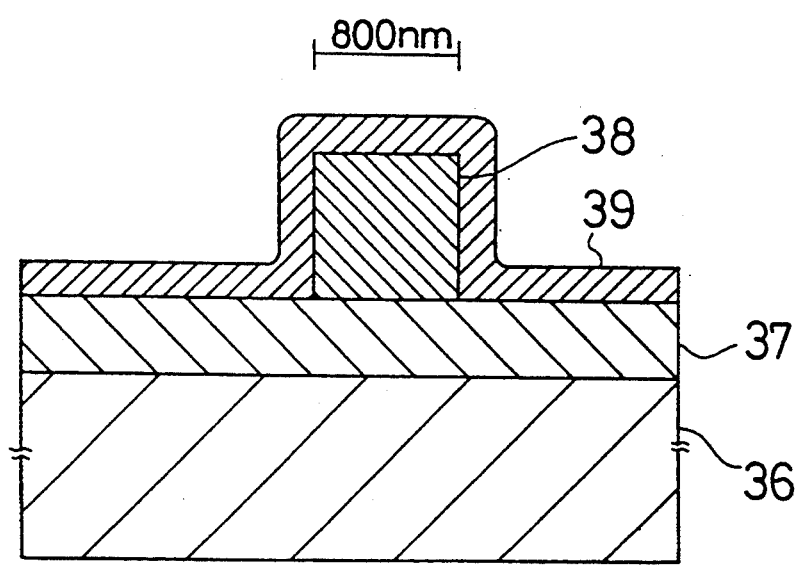
FIG. 16 is a section view of a semiconductor chip prepared by the CVD apparatus according to the third embodiment.
Figure 17:
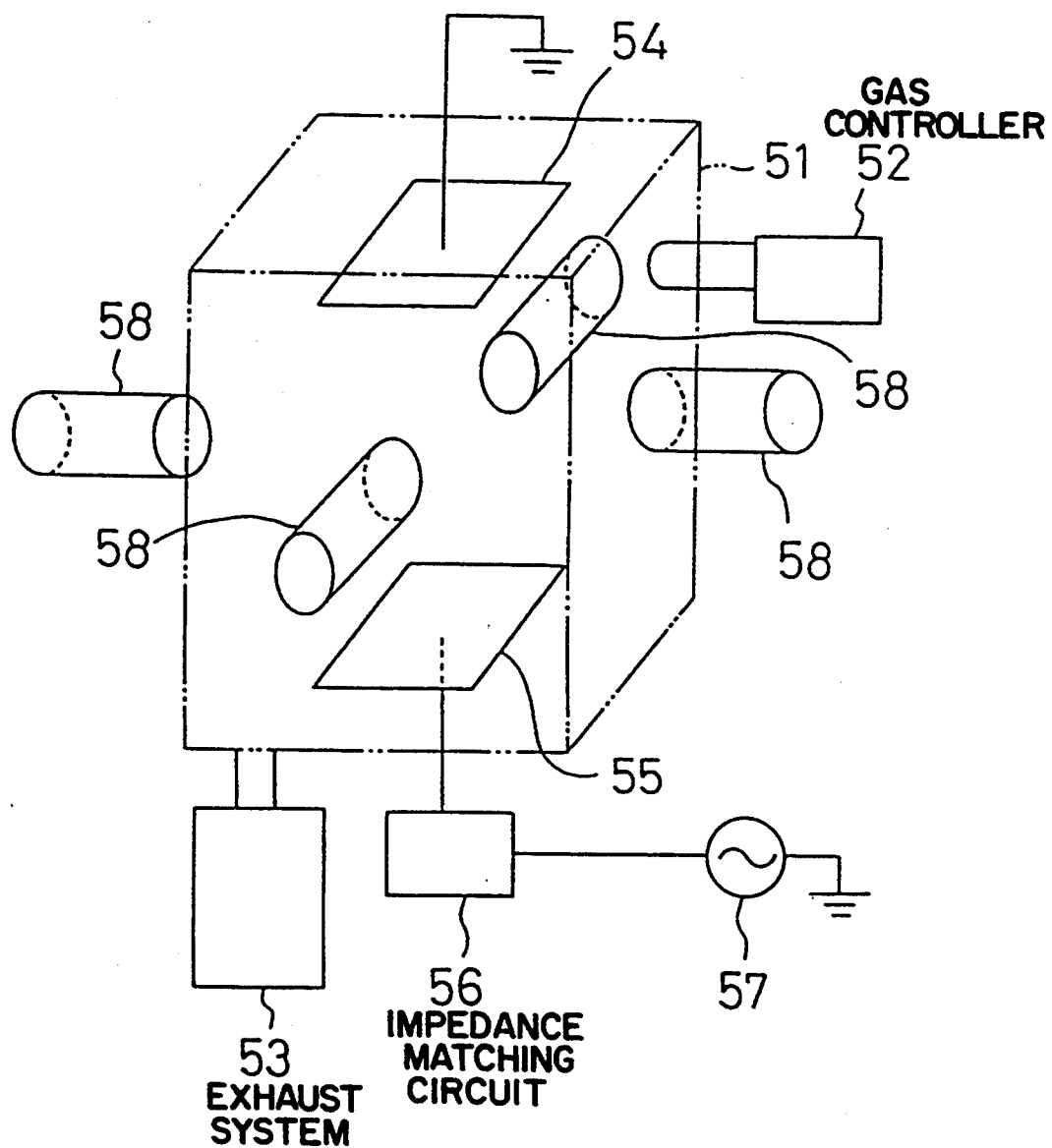
FIG. 17 is a schematic diagram of a conventional magnetron reactive ion etching apparatus.
Figure 18A:
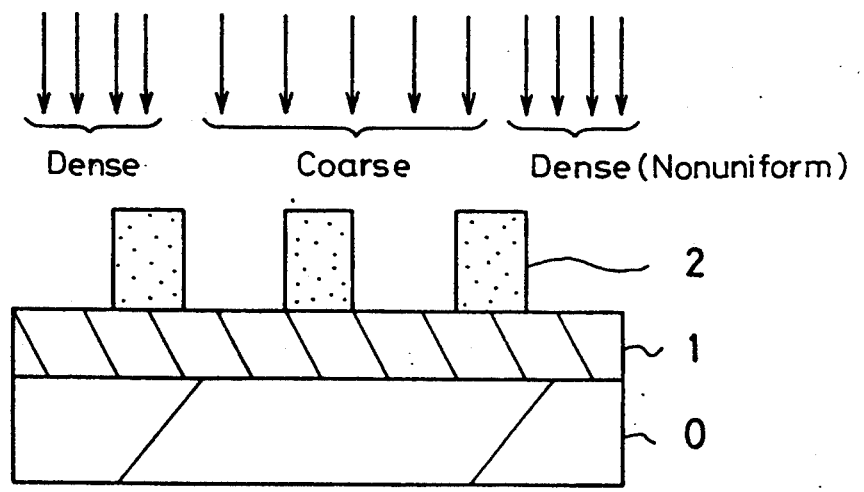
FIG. 18(a) is a section view of etching boron phosphorus glass with a conventional magnetron reactive ion etching apparatus or ECR etching apparatus.
Figure 18B:
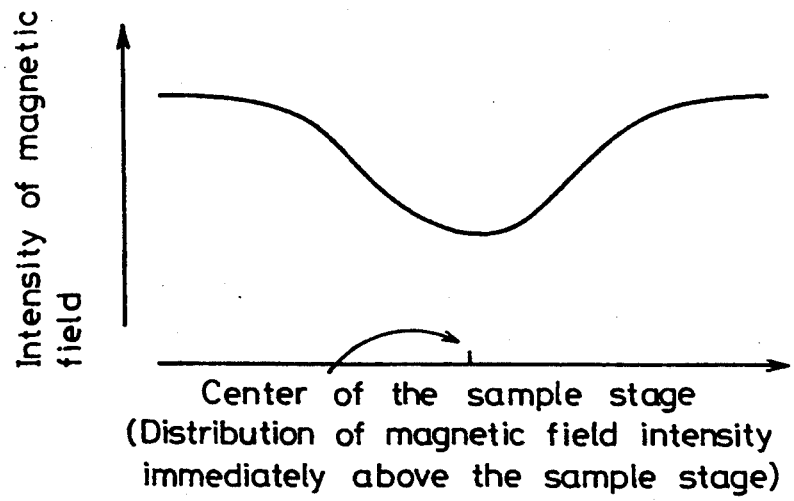
FIG. 18(b) is a view illustrating the ununiformity of etching in conventional magnetron reactive ion etching or ECR etching.

FIG. 16 shows a section of a semiconductor chip prepared by the CVD apparatus. A hot oxide layer 37 is formed on a Si substrate 36. Aluminium 38 deposited in a thickness of 0.8 $\mu$m by sputtering, is made in the form of a wire having a width of 0.8 $\mu$m by photolithography and dry-etching. On the aluminium 38, a SiN layer 39 is deposited by the CVD apparatus.

This CVD apparatus is suitably used in a CVD method for a 6" or 8" large-diameter semiconductor wafer. That is, as discussed in connection with the dry etching apparatus, the CVD apparatus can enhance the spatial uniformity of a plasma so that a deposit layer can be uniformly formed on the wafer in its entirety.

What is claimed is:

1. A plasma generating method comprising the steps of:

disposing four or more electrodes at lateral sides of a plasma generating part in a vacuum chamber; and respectively supplying, to said four or more electrodes, high frequency electric powers which are supplied from a high frequency AC power supply, which have the same frequency, and of which respective phases are successively different from one another, thereby to apply, to said plasma generating part, a rotational electric field such that potential pockets are rotated, causing electrons in said plasma generating part to be rotated as confined in said potential pockets;

whereby a highly dense and uniform plasma is generated in said plasma generating part.

2. A plasma generating apparatus comprising:
a vacuum chamber having a plasma generating part;
four or more electrodes disposed at lateral sides of said plasma generating part; and
electric field applying means for respectively supplying, to said four or more electrodes, high frequency electric powers which have the same frequency and of which respective phases are successively different from one another, thereby to apply, to said plasma generating part, a rotational electric field which is adapted to form potential pockets where electrons in said plasma generating part are rotated as confined in said potential pockets.

3. A plasma generating apparatus according to claim 2, further comprising a sample stage disposed at a lower part of the plasma generating part.

4. A plasma generating apparatus according to claim 2, wherein the number of the four or more electrodes is an even number, and the electric field applying means is a single-phase magnetron of which output terminals are respectively connected to the four or more electrodes.

5. A plasma generating apparatus according to claim 2, wherein the electric field applying means comprises:
a high frequency AC power supply for supplying high frequency electric powers which have the same frequency and of which respective phases are successively different from one another; and
a high frequency AC amplifying device for amplifying said high frequency electric powers supplied from said high frequency AC power supply and for supplying said high frequency electric powers thus amplified to the four or more electrodes.

6. A plasma generating apparatus according to claim 5, wherein the number of the four or more electrodes is an even number, the high frequency AC power supply is a single-phase magnetron, and the high frequency AC amplifying device is a single-phase amplitron of which input terminals are connected to the output terminals of said single-phase magnetron and of which output terminals are respectively connected to the four or more electrodes.

7. A plasma generating method comprising the steps of:
disposing three or more electrodes at lateral sides of a plasma generating part in a vacuum chamber such that said three or more electrodes surround said plasma generating part; and
respectively supplying, to said three or more electrodes, high frequency electric powers which are supplied from a polyphase magnetron which generates an alternating current of which the respective phases are successively different from one another;
whereby a highly dense and uniform plasma is generated in said plasma generating part.

8. The plasma generating method according to claim 7, further comprising the steps of:
disposing a sample stage at a lower part of said plasma generating part; and
supplying, to said sample stage, a second high frequency electric power having a frequency different from the frequency of said high frequency electric powers which are supplied from said polyphase magnetron.

9. The plasma generating method according to claim 8, wherein the frequency of said high frequency electric powers which are supplied from said polyphase magnetron is higher than the frequency of said second high frequency electric power.

10. The plasma generating method according to claim 7, wherein in the step of respectively supplying, to said three or more electrodes, the high frequency electric powers which are supplied from said polyphase magnetron, the high frequency electric powers are amplified by a high frequency AC amplifying device.

11. A plasma generating apparatus comprising:
a vacuum chamber having a plasma generating part;
three or more electrodes disposed at lateral sides of said plasma generating part such that said three or more electrodes surround said plasma generating part; and
a polyphase magnetron which generates an alternating current, and which supplies respectively, to said three or more electrodes, high frequency electric powers of which the respective phases are successively different from one another.

12. The plasma generating apparatus according to claim 11, further comprising:
a sample stage disposed at a lower part of said plasma generating part; and
a high frequency power supply means for supplying, to said sample stage, a second high frequency electric power of a frequency which is different from the frequency of said high frequency electric powers which are supplied from said polyphase magnetron.

13. The plasma generating apparatus according to claim 12, wherein the frequency of said high frequency electric powers which are supplied from said polyphase magnetron is higher than the second high frequency electric power supplied by said high frequency power supply means.

14. The plasma generating apparatus according to claim 11, further comprising a high frequency AC amplifying device for amplifying said high frequency electric powers supplied from said polyphase magnetron.

15. A plasma generating method comprising the steps of:
disposing three or more electrodes at lateral sides of a plasma generating part in a vacuum chamber such that said three or more electrodes surround said plasma generating part, and disposing a sample stage at a lower part of said plasma generating part;
respectively supplying, to said three or more electrodes, first high frequency electric powers of a first frequency, said first frequency having phases which are successively different from one another; and
supplying, to said sample stage, a second high frequency electric power of a second frequency which is different from said first frequency.

16. The plasma generating method according to claim 15, wherein said first frequency is higher than said second frequency.

17. A plasma generating apparatus, comprising:
a vacuum chamber having a plasma generating part;
a sample stage disposed at a lower part of said plasma generating part;
three or more electrodes disposed at lateral sides of said plasma generating part such that said three or more electrodes surround said plasma generating part;
a first high frequency power supply means for respectively supplying, to said three or more electrodes, first high frequency electric powers of a first frequency, said first frequency having phases which are successively different from one another; and
a second high frequency power supply means for supplying, to said sample stage, second high frequency electric power of a second frequency which is different from said first frequency.

18. The plasma generating apparatus according to claim 17, wherein said first frequency is higher than said second frequency.

* * * * *